United States Patent
Okuda (10) Patent No.: US 11,567,287 B2
(45) Date of Patent: Jan. 31, 2023

(54) LENS BARREL AND IMAGING APPARATUS

(71) Applicant: CANON KABUSHIKI KAISHA, Tokyo (JP)

(72) Inventor: Toshihiro Okuda, Utsunomiya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 600 days.

(21) Appl. No.: 16/029,819

(22) Filed: Jul. 9, 2018

(65) Prior Publication Data
US 2019/0018213 A1    Jan. 17, 2019

(30) Foreign Application Priority Data

Jul. 13, 2017  (JP) .............................. JP2017-136698

(51) Int. Cl.
| | |
|---|---|
| G02B 7/02 | (2021.01) |
| H05K 1/03 | (2006.01) |
| G02B 7/10 | (2021.01) |
| G02B 7/09 | (2021.01) |
| H04N 5/232 | (2006.01) |

(52) U.S. Cl.
CPC .............. *G02B 7/021* (2013.01); *G02B 7/09* (2013.01); *G02B 7/10* (2013.01); *H05K 1/0393* (2013.01); *H04N 5/232122* (2018.08)

(58) Field of Classification Search
CPC . G02B 7/021; G02B 7/09; G02B 7/10; H05K 1/0393; H05K 1/189; H05K 1/188; H05K 7/1434; H05K 2201/051
See application file for complete search history.

(56) References Cited

U.S. PATENT DOCUMENTS

| | | | | |
|---|---|---|---|---|
| 5,371,569 A | * | 12/1994 | Tanaka ..................... | G02B 7/08 361/749 |
| 5,559,571 A | * | 9/1996 | Miyamoto ............. | G03B 17/00 396/529 |
| 2009/0040369 A1 | * | 2/2009 | Miyoshi ................... | G03B 3/10 348/374 |

FOREIGN PATENT DOCUMENTS

| | | |
|---|---|---|
| JP | H05134161 A | 5/1993 |
| JP | 2009128593 A | 6/2009 |
| JP | 2011158725 A | 8/2011 |
| JP | 2012073655 A | 4/2012 |
| JP | 2013061386 A | 4/2013 |
| JP | 2014191164 A | 10/2014 |

(Continued)

OTHER PUBLICATIONS

Office Action issued in Japanese Appln. No. 2017-136698 dated May 25, 2021. English translation provided.

*Primary Examiner* — Alicia M Harrington
(74) *Attorney, Agent, or Firm* — Rossi, Kimms & McDowell LLP (57) ABSTRACT

A lens apparatus includes an optical system, a holding barrel configured to hold at least part of the optical system, an electric unit attached to the holding barrel, a control board configured to control the electric unit, a flexible printed circuits board configured to connect the electric unit and the control board to each other, a holding member attached to the holding barrel and configured to hold the flexible printed circuits board, and a fixing member configured to attach the holding member to the holding barrel. The flexible printed circuits board includes a first bent part, and the fixing member has a receiving surface configured to receive a reaction force from the first bent part.

17 Claims, 7 Drawing Sheets

(56) References Cited

FOREIGN PATENT DOCUMENTS

| | | |
|---|---|---|
| JP | 2016122118 A | 7/2016 |
| JP | 2016218246 A | 12/2016 |

\* cited by examiner

LENS BARREL AND IMAGING APPARATUS

BACKGROUND OF THE INVENTION

Field of the Invention

The present invention relates to a lens barrel that provides an electric connection using a flexible printed circuits ("FPC") board.

Description of the Related Art

One conventionally known lens barrel has an FPC board that electrically connect an electric component with a control board that controls the electric component. Use of the FPC board can improve the connection freedom degree between the electric component and the control board, such as routing on a flat surface, routing on planes having different heights, routing on a curved surface. However, when the FPC board is routed on the planes having different heights or the curved surface other than the flat surface, the routed spot floats due to the reaction force of the FPC board and causes unstable routing between the electric component and the control board.

As a solution for this problem, Japanese Patent Laid-Open No. ("JP") 2013-61386 discloses a lens unit that includes a suppressor that suppresses a swell of the FPC board, and a presser that presses the FPC board against a holding member.

JP 2013-61386 can suppress the lift or float of the FPC board through the suppressor and the presser and stabilize the routing if FPC board would otherwise lift due to the reaction force. However, the lens unit disclosed in JP 2013-61386 needs a fixing member and a space for the fixing member to extend in the circumferential direction.

SUMMARY OF THE INVENTION

The present invention provides a lens apparatus and an imaging apparatus that can stabilize routing of a flexible printed circuits board in a space-saving manner.

A lens apparatus according to one aspect of the present invention includes an optical system, a holding barrel configured to hold at least part of the optical system, an electric unit attached to the holding barrel, a control board configured to control the electric unit, a flexible printed circuits board configured to connect the electric unit and the control board to each other, a holding member attached to the holding barrel and configured to hold the flexible printed circuits board, and a fixing member configured to attach the holding member to the holding barrel. The flexible printed circuits board includes a first bent part, and the fixing member has a receiving surface configured to receive a reaction force from the first bent part.

An imaging apparatus according to another aspect of the present invention includes the above lens barrel and an image sensor configured to photoelectrically convert an optical image formed by the lens barrel.

Further features of the present invention will become apparent from the following description of exemplary embodiments with reference to the attached routings.

DESCRIPTION OF THE EMBODIMENTS

Referring now to the accompanying drawings, a description will be given of embodiments according to the present invention.

First Embodiment

Figure 1:
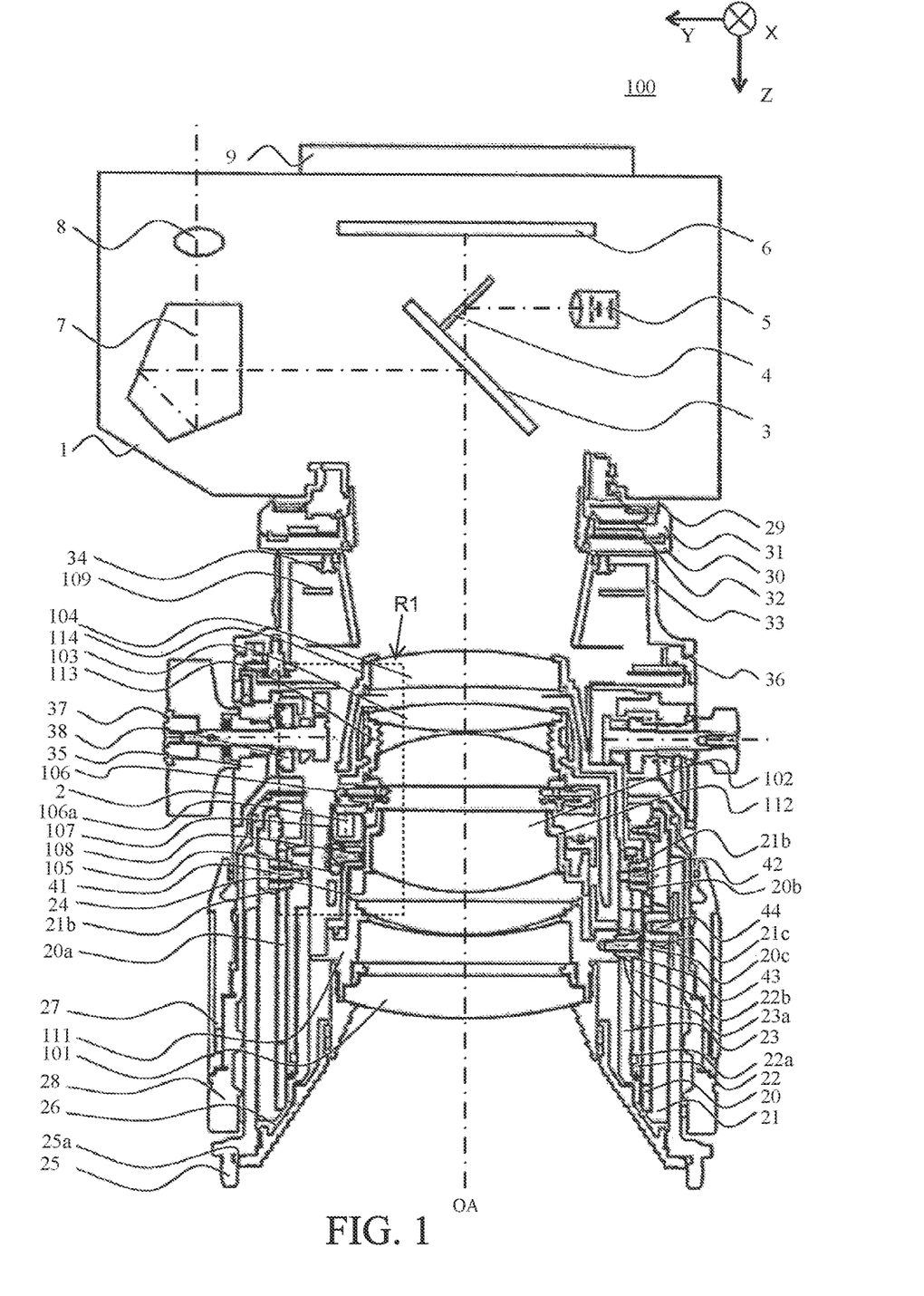
FIG. 1 is a sectional view of an imaging apparatus according to a first embodiment.

Referring now to FIG. 1, a description will be given of an imaging apparatus according to a first embodiment of the present invention. FIG. 1 is a sectional view of an imaging apparatus (optical apparatus) 100. The imaging apparatus 100 includes a lens barrel (interchangeable lens) 2 and a camera body (single lens reflex digital camera body) 1 to which the lens body 2 is attachable. In FIG. 1, a Z direction is an optical axis direction along a lens optical axis (simply referred to as an "optical axis" hereinafter) OA, an X direction is a lateral direction among two directions parallel to the imaging plane orthogonal to the optical axis OA, and a Y direction is a longitudinal direction. This embodiment discusses an optical apparatus as an interchangeable lens that includes a shifter and a focus corrector, but is applicable to a lens integrated type imaging apparatus.

A description will now be given of the structure of the camera body 1. A main mirror 3, when disposed on an optical path of a light flux from the lens barrel 2, as illustrated in FIG. 1, reflects part of the light flux, guides it to finder optical systems 7 and 8, and transmits the remaining light flux. A sub-mirror 4 disposed behind (on an imaging plane side of) the main mirror 3 reflects the light flux that has transmitted through the main mirror 3 and guides it to a focus detecting unit 5. The main mirror 3 and the sub-mirror 4 can be retreated from the optical path by an unillustrated drive mechanism.

The focus detecting unit 5 detects a focus state of the lens barrel 2 by a phase difference detecting method (or provides a focus detection). An image sensor 6 includes a CCD sensor and a CMOS sensor. An object image (optical image) is formed by the light flux from the lens barrel 2, on the light receiving surface (imaging plane) of the image sensor 6. The image sensor 6 outputs an image signal by photoelectrically converting the object image formed by the lens barrel 2. A display panel 9 displays information on an image generated by an unillustrated signal processor based on the image signal and various images.

The camera body 1 according to this embodiment is a single lens reflex camera that includes the main mirror 3, the sub-mirror 4, and the focus detecting unit 5, but the camera body 1 may be a so-called mirrorless (nonreflex) camera that has none of the main mirror 3, the sub-mirror 3, and the focus detecting unit 5. In addition, instead of the focus detecting unit 5, an imaging plane phase difference detecting type focus detection may be performed based on the image signal from the image sensor 6. Alternatively, a contrast detecting type focus detection may be performed with the image signal obtained from the image sensor 6.

Next follows a description of a structure of the lens barrel 2. The lens barrel 2 includes an imaging optical system (optical system). The imaging optical system includes, in order from an object side to an imaging plane side, a first lens unit 101, a second lens unit 102, a diaphragm (stop) unit 106, a third lens unit 103, and a fourth lens unit 104. In the lens barrel 2, as described later, as a first cam cylinder 21 relatively rotates around the optical axis OA, a linear movable cylinder 22 and a second cam cylinder 23 interlock and the first lens unit 101 to the fourth lens unit 104 move in the optical axis direction.

The first lens unit 101 is held by a first lens holder frame 111, and the second lens unit 102 is held by a second lens holder frame 112. The third lens unit 103 is held by a third lens holder frame 113, and the fourth lens unit 104 is held by a fourth lens holder frame 114. The diaphragm unit 106 as an electric unit adjusts a light quantity incident on the camera body 1. The diaphragm unit 106 and a control board 109 are electrically connected to each other by a flexible printed circuits ("FPC") board 105. A guide member (holding member) 107 guides the FPC board 105 along the optical axis direction, and is fixed by a fixing member 108. An aperture diameter in the diaphragm unit 106 and the light quantity incident on the camera body 1 are changed when the electric signal from the control board 109 is input to a driver 106a in the diaphragm unit 106.

The second lens holding frame 112 and the third lens holding frame 113 are fixed onto a holding barrel 24 via an unillustrated attachment member. The holding barrel 24 is fixed onto the first lens holding frame 111 by an unillustrated fastening member. The diaphragm unit 106 is fixed onto the holding barrel 24 by the unillustrated fastening member. The fourth lens holding frame 114 is fixed onto the linear movable cylinder 22 via the unillustrated fastening member.

When an unillustrated bayonet tab provided to the second cam cylinder 23 is engaged with a bayonet groove 22a in the linear movable cylinder 22, the second cam cylinder 23 is held by the linear movable cylinder 22 so that the second cam cylinder 23 rotates at a fixed position. When an unillustrated thrust restricting member attached to the guide cylinder 20 is engaged with an unillustrated circumferential groove part provided in the first cam cylinder 21, the first cam cylinder 21 is held by the guide cylinder 20 so that the first cam cylinder 21 can rotate at a fixed position. A first cam follower 41 attached to the linear movable cylinder 22 is engaged with the linear (movement) groove 20a provided to the guide cylinder 20 and a first cam groove 21b provided to the first cam cylinder 21. A second cam follower 42 attached to the second cam cylinder 23 is engaged with the cam groove 20b in the guide cylinder 20.

Next follows interlocks among the guide cylinder 20, the first cam cylinder 21, the linear movable cylinder 22, and the second cam cylinder 23. As the first cam cylinder 21 rotates, the crossing position between the first linear groove 20a and the first cam groove 21b changes and thereby the linear movable cylinder 22 linearly moves in the optical axis direction along the locus of the first cam groove 21b. When the linear movable cylinder 22 linearly moves, the second cam cylinder 23 held by the linear movable cylinder 22 rotatable at the fixed position linearly moves by the same amount. In this case, since the second cam follower 42 attached to the second cam cylinder 23 is engaged with the cam groove 20b in the guide cylinder 20, the second cam cylinder 23 rotates by the amount of the locus of the cam groove 20b while linearly moving by the same amount of the linear movable cylinder 22. In other words, in association with the rotation of the first cam cylinder 21, the second cam cylinder 23 can be rotated. The rotating amounts or the rotating speeds of the two components may be made different depending on the loci of the first cam groove 21b and the cam groove 20b.

Next follows a movement of each lens holding frame. A third cam follower 43 provided to the first lens holding frame 111 is engaged with a linear (movement) groove 22b provided in the linear movable cylinder 22 and the cam groove 23a provided in the second cam cylinder 23. As described above, the fourth lens holding frame 114 is attached to the linear movable cylinder 22. As described, as the first cam cylinder 21 rotates, the linear movable cylinder 22 linearly moves and thus the fourth lens holding frame 114 linearly moves in the optical axis direction by the same amount as the linear movable cylinder 22. In addition, as the first cam cylinder 21 rotates, the second cam cylinder 23 rotates. Thus, first lens holding frame 111 linearly moves in the optical axis direction by an amount made by adding a drawing amount of the linear movable cylinder 22 in the optical axis direction to a changing amount of the crossing position between the linear groove 22b and the cam groove 23. Since the second lens holding frame 112 and the third lens holding frame 113 are fixed onto the first lens holding frame 111 via the holding barrel 24, the first lens holding frame 111 to the third lens holding fame 111 move in the optical axis direction by the same amounts.

A fourth cam follower 44 is attached to a filter frame 25 that has a screw part 25a to which an accessory, such as a filter, is attachable at the tip, and engaged with a second linear (movement) groove 20c provided on the guide cylinder 20 and a second cam groove 21c provided on a first cam cylinder 21. As the first cam cylinder 21 rotates, a crossing position between the second linear groove 20c and the second cam groove 21c changes and the linear movable cylinder 22 linearly moves in the optical axis direction along the locus of the second cam groove 21c. A decorative ring 26 is an exterior component screwed onto the screw part 25a in the filter frame 25.

A fixing cylinder 28 is fixed onto the guide cylinder 20 by an unillustrated fastening member, and holds a focus (operating) ring 27 so that the focus ring 27 can rotate at a fixed position. The focus ring 27 is rotated by a user for manual focusing, and transmits a rotating force to the first cam cylinder 21. As the first cam cylinder 21 is rotated by the focus ring 27, the aforementioned interlock move the first lens unit 101 to the third lens unit 103 and the diaphragm unit 106 together in the optical axis direction. On the other hand, the fourth lens unit 104 moves in the optical axis direction independent of the first lens unit 101 to the third lens unit 103. The filter frame 25 independently moves in the optical axis direction. The focus ring 27, the guide cylinder 20, the first cam cylinder 21, the linear movable cylinder 22, the second cam cylinder 23 etc., constitute a manual focus mechanism (focusing unit). The first lens unit 101 to the fourth lens unit 104 may be driven by an electric actuator, such as a motor. A rotating amount and a rotating direction of the focus ring 27 are electrically detected, and the actuator that drives the first cam cylinder 21 may be controlled based on the electric signal.

Next follows a description of a tilt/shift mechanism in the lens barrel 2. An overall rotator 30 is coupled with a fixing member 31, rotatably around the optical axis OA, which is fixed onto a mount 29 connected to the camera 1, and a (rotatable) part on the object side of the overall rotator 30 in the lens barrel 2 is rotated around the optical axis OA. The rotating amount (angle) of the rotatable part is detected by an angular sensor 32.

The shifter 33 is shiftably coupled with the overall rotator 30 in a (shift) direction orthogonal to the optical axis OA, and the (shiftable) part on the object part of the shifter 33 in the lens barrel 2 is parallel moved in the shift direction. The shifter 33 has a mechanism that converts a rotating operation of an unillustrated shift operating knob into a force in the shift direction and shifts the shiftable part. A shift amount and a shift direction (vertical direction) of the shiftable part are detected by a shift sensor 34.

ATS rotator 36 rotates the shifter 33 and a tilter 35 relative to each other (TS rotation). The tilter 35 as a tilter/shifter tilts a (shiftable) part on the object side of the tilter 35 in the lens barrel 2 relative to the shifter 33 (or the camera body 1) around an axis orthogonal to the optical axis OA. More specifically, both a concave surface provided to the TS rotator 36 and a convex surface provided to the tilter 35 contact each other and are formed as a half-cylinder surface having the same center axis (tilt center) and the same radius. The tiltable part rotates (tilts) in the tilt direction by sliding the convex surface provided on the tilter 35 relative to the concave surface provided on the rotator 36. The tilter 35 serves to convert the rotating operation of the tilt operation knob 37 into the force in the tilt direction and to tilt the tiltable part. The tilt amount of the tiltable part and the tilt direction (vertical direction) are detected by the tilt sensor 38.

The overall rotator 30, the shifter 33, the tilter 35, and the TS rotator 36 can provide a combination of a shift and a tilt in any directions. The fixing cylinder 28 is fixed onto the tilter 35. When an unillustrated release button is operated in the camera body 1 mounted with the thus configured lens barrel 2, the autofocus and the photometry (exposure determination) are performed and then the exposure of the image sensor 6 and image generating and recording follow.

Figure 2:
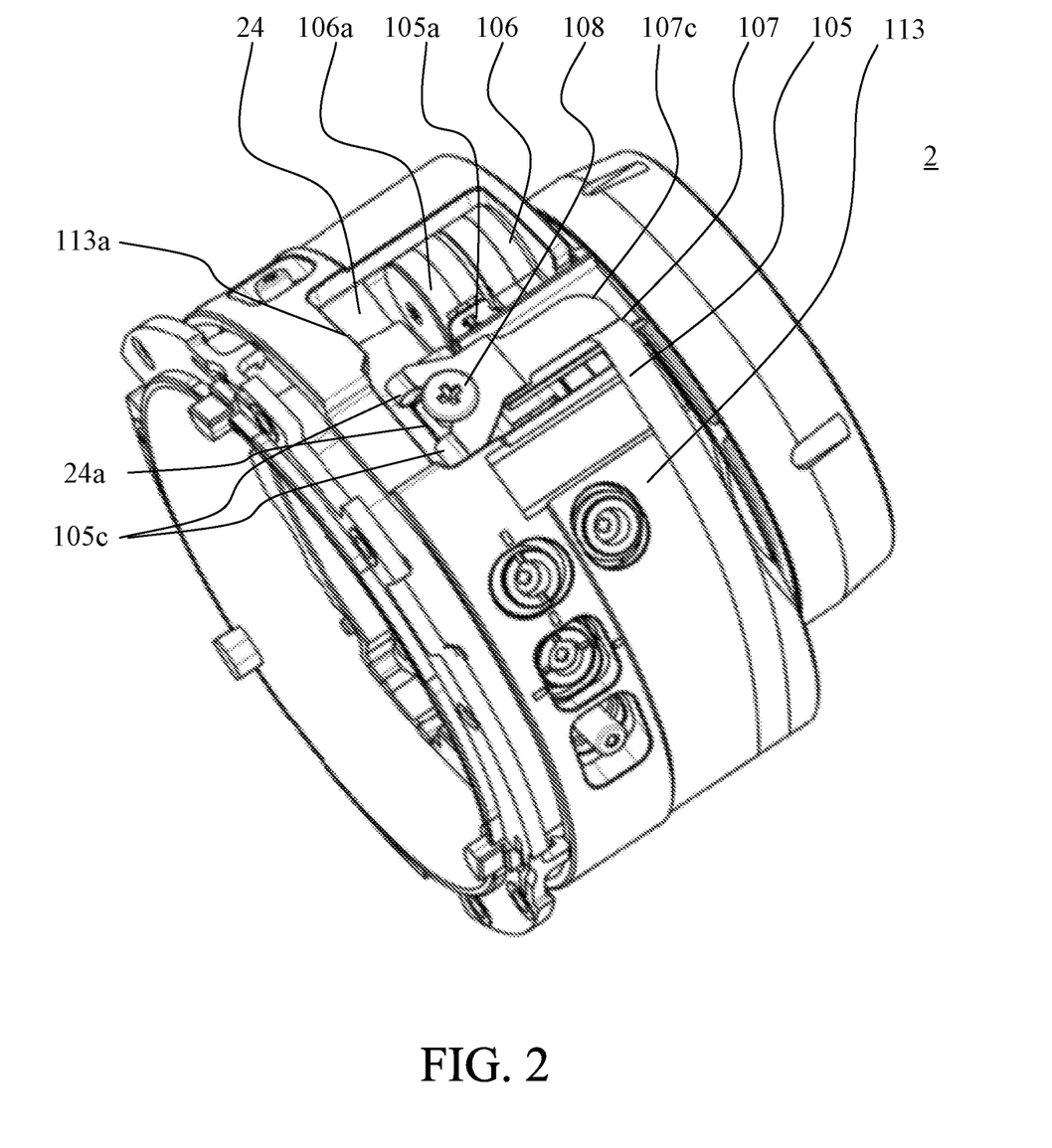
FIG. 2 is a partially perspective view of a lens barrel according to the first embodiment.
Figure 3:
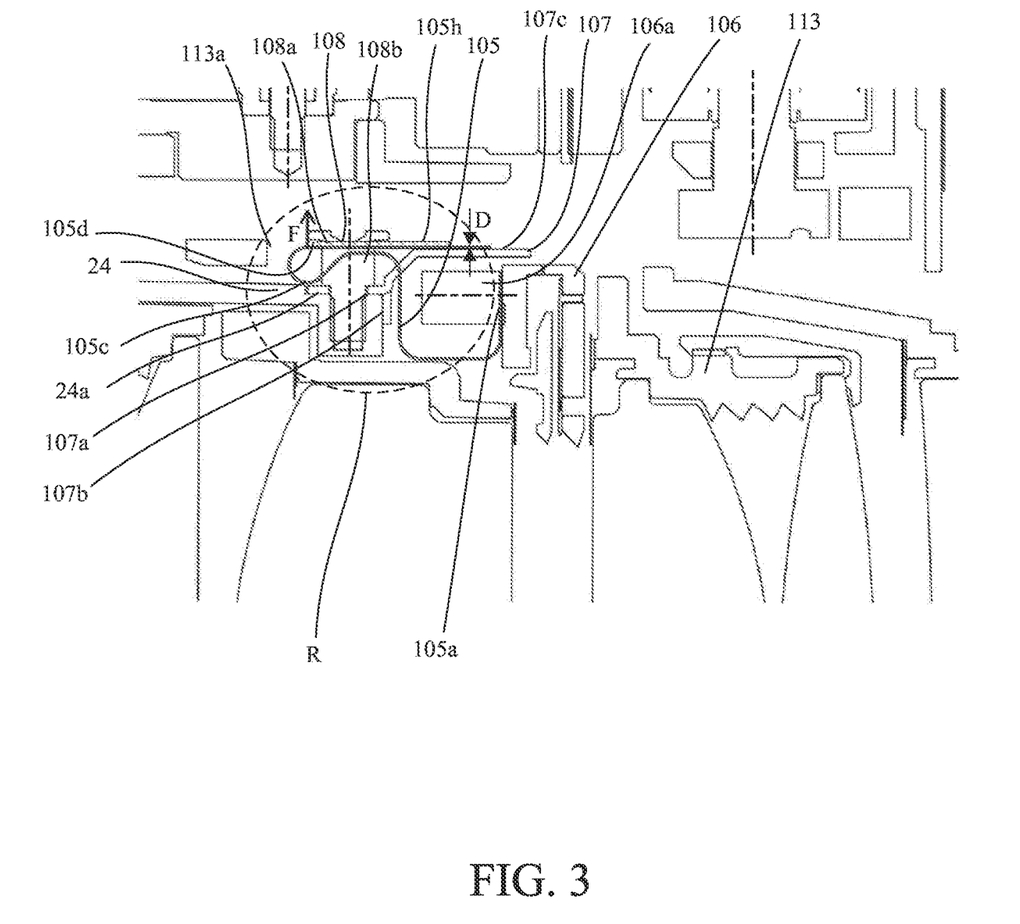
FIG. 3 is an enlarged view of principal part in the lens barrel according to the first embodiment.
Figure 4:
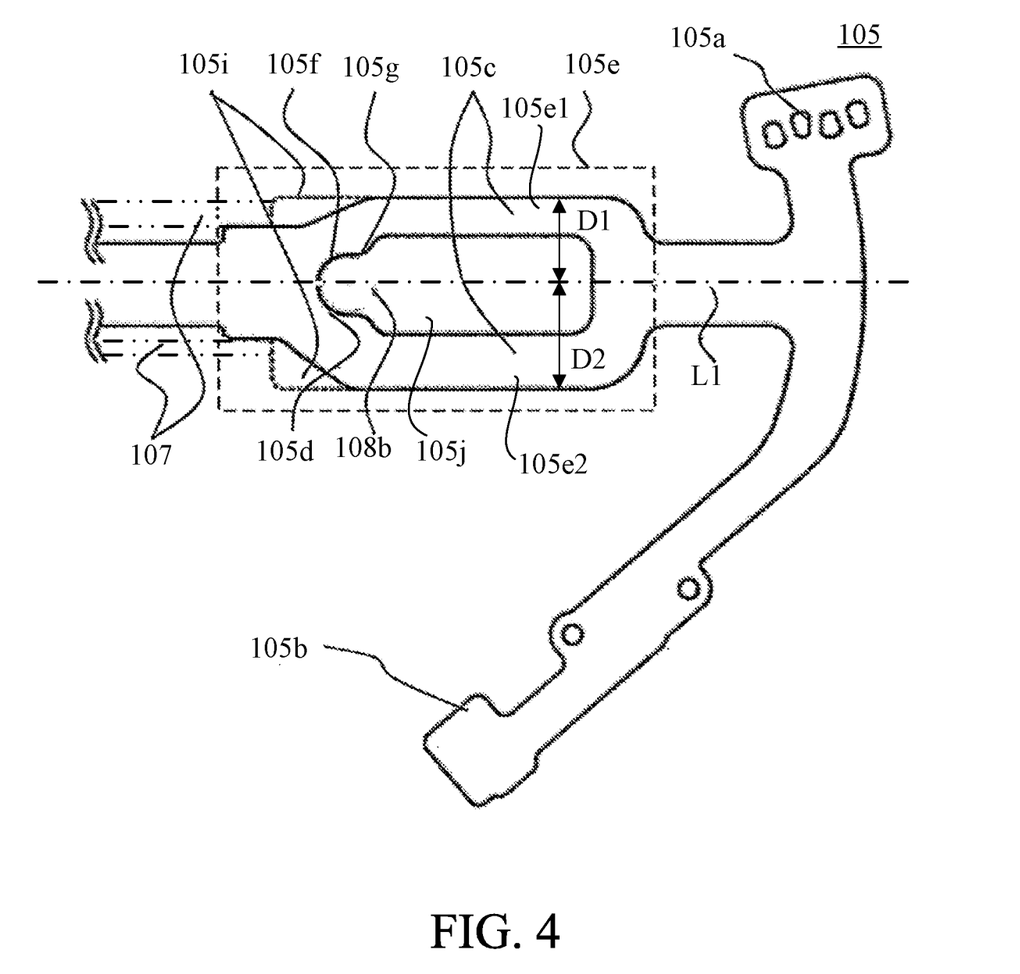
FIG. 4 illustrates an unfolded FPC board in the lens apparatus according to the first embodiment.

Referring now to FIGS. 2 to 4, a description will be given of the routing of the FPC board 105. FIG. 2 is a partially perspective view of the lens barrel 2. FIG. 3 is an enlarged view of a dotted, rectangular region R1 of the lens barrel 2 illustrated in FIG. 1. FIG. 4 is a developed view of the FPC board 105 according to this embodiment.

The diaphragm unit 106 as the electric unit includes a driver 106a that changes the aperture diameter and an unillustrated detector that resets the aperture diameter. Connectors 105a and 105b provided at one end of the FPC board 105 are connected to the driver 106a and the detector. The other end of the FPC board 105 is connected to the control board 109.

The diaphragm unit 106 is fixed onto the holding barrel 24 by the unillustrated fastening member. A contact surface 107a in the guide member (holding member) 107 is fixed onto a contact surface 24a of the holding barrel 24 by the fixing member 108. The guide member 107 has the contact surface 107a parallel to the contact surface 24a on the holding barrel 24, and a fall suppressive surface 107b perpendicular to the contact surface 107a so as to suppress the fall of the guide member 107. The guide member 107 includes a guide surface 107c for guiding the routing of the FPC board 105. As described above, the third lens holding frame 113 is fixed onto the holding barrel 24 by the unillustrated fixing member. The third lens holding frame 113 includes a clearance part 113a used for clearance of the driver 106a in the diaphragm unit 106.

In this embodiment, the FPC board 105 includes (first) bent parts 105c in a routing range R between the connectors 105a and 105b and the guide member 107. The fixing member 108 has a receiving surface 108a so as to receive the reaction force F caused by the bent parts 105c. When the contact part 105d in the FPC board 105 contacts the receiving surface 108a, the FPC board 105 is positioned in the radial direction (vertical direction in FIG. 3) orthogonal to the optical axis direction.

Next follows a description of an assembly procedure of the lens barrel 2. In assembly of the lens barrel 2, the FPC board 105 fixes onto the holding barrel 24 the diaphragm unit 106 connected by the connectors 105a and 105b. Thereafter, the third lens holding frame 113 is assembled. As illustrated in FIG. 2, in an attempt to assemble the third lens holding frame 113 in the optical axis direction, the driver 106a in the diaphragm unit 106 interferes. Thus, the third lens holding frame 113 is assembled while maintained in an oblique state. In this case, the other end of the FPC board 105 penetrates through the clearance part 113a in the third lens holding frame 113.

Next, the guide member 107 is attached to the holding barrel 24 by the fixing member 108 in the radial direction (orthogonal to the optical axis). The FPC board 105 has a branched part 105e in the routing range R so that the fixing member 108 is attached without interfering with the FPC board 105. The branched part 105e has an opening 105j that is larger than an attachment surface on the fixing member 108 to the holding barrel 24 and larger than a projected shape of the fixing member 108 in the radial direction.

The FPC board 105 is routed and forms the bent parts 105c such that the receiving surface 108a on the fixing member 108 contacts the contact part 105d in the FPC board 105. Finally, part of the FPC board 105 and the guide surface 107c are adhered to each other by the adhesive agent and positioned.

This embodiment receives the reaction force F from the FPC board 105 using the fixing member 108a and can suppress the lift (or float) of the FPC board 105. Since the fixing member 108 for fixing the guide member 107 serves to prevent the lift and enables the FPC board 105 to be stably routed in a space-saving manner. Moreover, the fixing member 108 serves to fix the guide member 107 and to suppress the lift of the FPC board 105, making the lens barrel inexpensive.

This embodiment provides the branched part 105e in the routing range R between the connectors 105a and 105b of the FPC board 105 and the guide member 107. As described above, the branched part 105e has the opening 105j that is larger than the attachment surface on the fixing member 108 to the holding barrel 24 and larger than the projected shape of the fixing member 108 in the radial direction. Since the branched contact part 105d sandwich the receiving surface 108a on the fixing member 108, the FPC board 105 can be more stably routed. This is because the reaction force would generate a force tilting the contact part 105d if the contact part 105d contacts only one side of the fixing member 108. The fixing member 108 sandwiched by the contact part 105d as in this embodiment can cancel the tilting force and stabilize the routing.

The branched part 105e may be of an approximately line-symmetry with respect to a line L1 that is parallel to the optical axis OA and passes the center of the fixing member 108. In other words, in FIG. 4, a distance D1 from the top end of an upper branched part 105e1 to the line L1 and a distance D2 from the bottom end of a lower branched part 105e2 to the line L1 are approximately equal to each other.

In the meanwhile, the approximate line symmetry can mean a substantial line symmetry, and allows, for example, a range of $0.8 \le D2/D1 \le 1.2$.

The shape of the guide member 107 is of an approximately line symmetry with respect to the optical axis around the fixing member 108. Thereby, the FPC board 105 can be more stably routed. As understood from FIG. 4, when a branch end 105f of the branched part 105e in the FPC board 105 contacts the shaft part 108b in the fixing member 108, the FPC board 105 can be positioned in the optical axis direction. This configuration can stably position the FPC board 105.

As described above, in this embodiment, the FPC board 105 and the guide surface 107c are adhesive to each other by the adhesive agent and positioned. In this embodiment, the branch end 105f has an R shape and the shaft part 108b has a cylindrical shape. Thus, in adhering the fixing member 108, the FPC board 105 can be rotated around the shaft part 108b and the routing of the FPC board 105 can be adhered in a flat state.

In addition, this embodiment provides a narrow part (end) 105g narrower than the opening 105j in the branched part 105e from the center part of the branched part 105e to the branched end 105f and wider than the branch end 105f. In assembly, this configuration provides positioning in a direction parallel to the guide surface 107c and perpendicular to the optical axis before the shaft part 108b in the fixing member 108 contacts the branched end 105f, improving the assembly performance.

This embodiment provides a reinforcing member 105h to the contact part 105d in the FPC board 105 at the position corresponding to the receiving surface 108a on the fixing member 108. The reinforcing member 105h is a reinforcing plate integrated with the FPC board 105 but this embodiment is not limited to this example and may be a reinforcing plate provided as another component separate from the FPC board 105. Alternatively, the pattern of the FPC board 105 may form the reinforcing member. This configuration can reinforce part directly receiving the reaction force of the FPC board 105. This configuration prevents the FPC board 105 from being disconnected, and provides the stable routing and positioning. The reinforcing member 105h is held by the fixing member 108 and the guide member 107. Thereby, after the FPC board 105 is assembled, the reinforcing member 105h is restricted by the receiving surface 108a on the fixing member 108 in the radial direction, and positioned by the fixing member 108 and the guide member 107 in the (optical) axial direction parallel to the guide surface 107c.

In this embodiment, the position of the reinforcing member 105h is determined by the fixing member 108 and the guide member 107, but the reinforcing member 105h may not be firmly held by the fixing member 108 and the guide member 107. Even holding with a clearance between them can prevent the FPC board 105 from being detached from the fixing member 108, and reliably route the FPC board 105.

This embodiment determines, but is not limited to, a position between part of the FPC board 105 and the guide surface 107c through an adhesion by the adhesive agent. For example, the FPC board 105 can be held without adhesion by setting its shape for more stable positioning, such as an external shape illustrated by a dotted part 105i.

In this embodiment, the receiving surface 108a on the fixing member 108 and the guide surface 107c on the guide member 107 are parallel to each other and do not overlap each other. A distance D between the receiving surface 108a and the guide surface 107c is equal to or smaller than a thickness T1 of the FPC board 105 in the axial direction (radial direction) perpendicular to the guide surface 107c. For example, $0.9 \le D/T1 \le 1.1$ may be satisfied. In this embodiment, an upward direction of the guide surface 107c is opposite to a downward direction of the receiving surface 108a, but the guide surface 107c turns downwardly similar to the receiving surface 108a. In this case, for example, $0 \le D/T1 \le 0.5$ may be satisfied. In addition, this embodiment considers a thickness T2 of the reinforcing plate 105h if the reinforcing plate 105h is provided. In this case, when the guide surface 107c turns upwardly, $0.9 \le D/(T1+T2) \le 1.1$ may be satisfied. In addition, when the guide surface 107c turns downwardly, $0 \le D/(T1+T2) \le 0.5$ may be satisfied. The effects will be described as follows.

As described above, the contact part 105d in the FPC board 105 contacts the receiving surface 108a in the fixing member 108 due to the reaction forces F of the bent parts 105c. In other words, the contact with the receiving surface 108a rectifies the lifting power and enables the FPC board 105 to be stably routed. When the guide surface 107c is level with the receiving surface 108a, the FPC board 105 can be stably routed. In this embodiment, the opposite surfaces of the FPC board 105 contacts the receiving surface 108a and the guide surface 107c. Thus, a distance between the receiving surface 108a and the guide surface 107c is approximately equal to the thickness of the FPC board 105 can stabilize the routing. When the same surface of the FPC board 105 contacts the receiving surface 108a and the guide surface 107c, the height adjustment may be provided.

Second Embodiment

Figure 5:
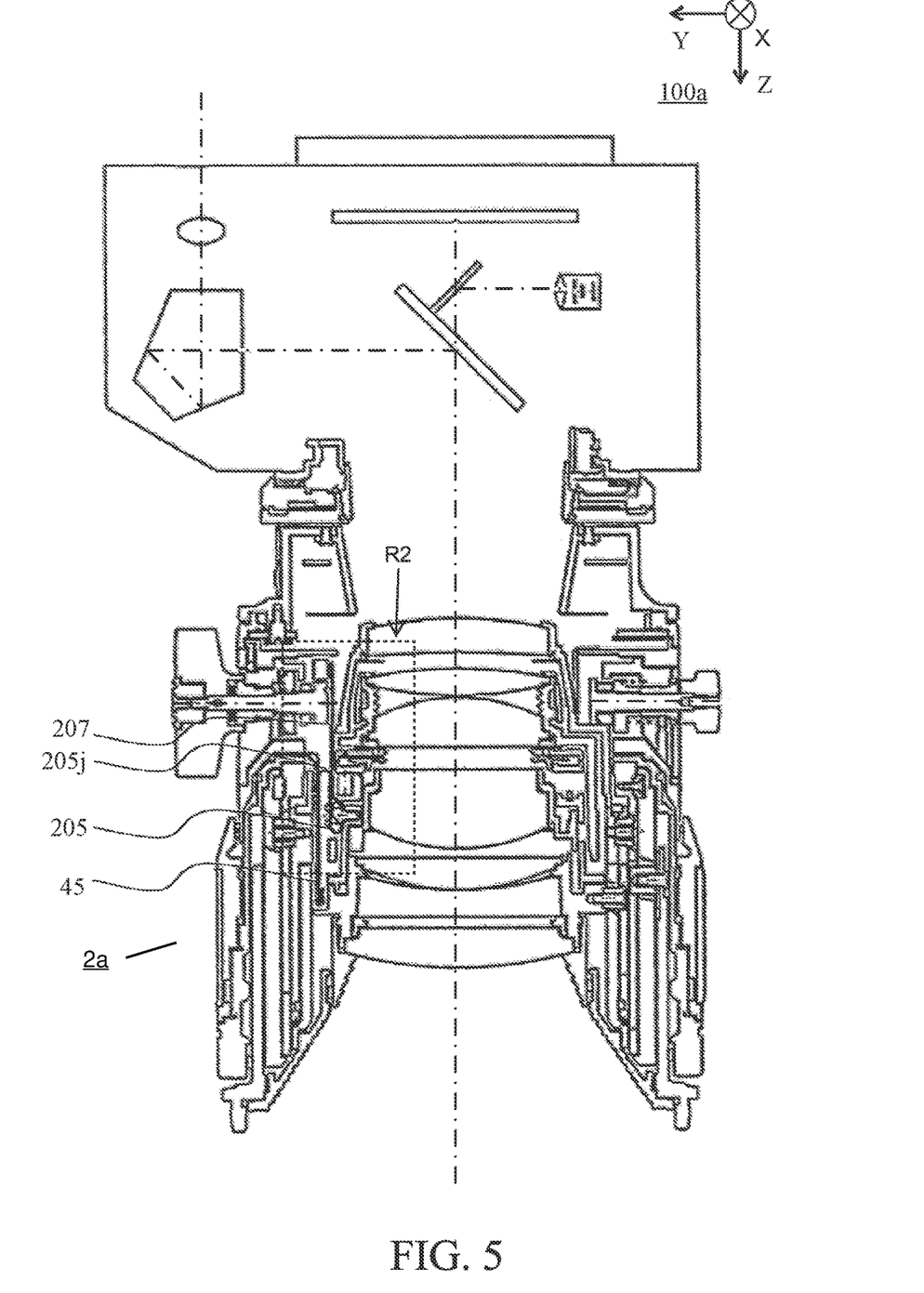
FIG. 5 is a sectional view of an imaging apparatus according to a second embodiment.
Figure 6:
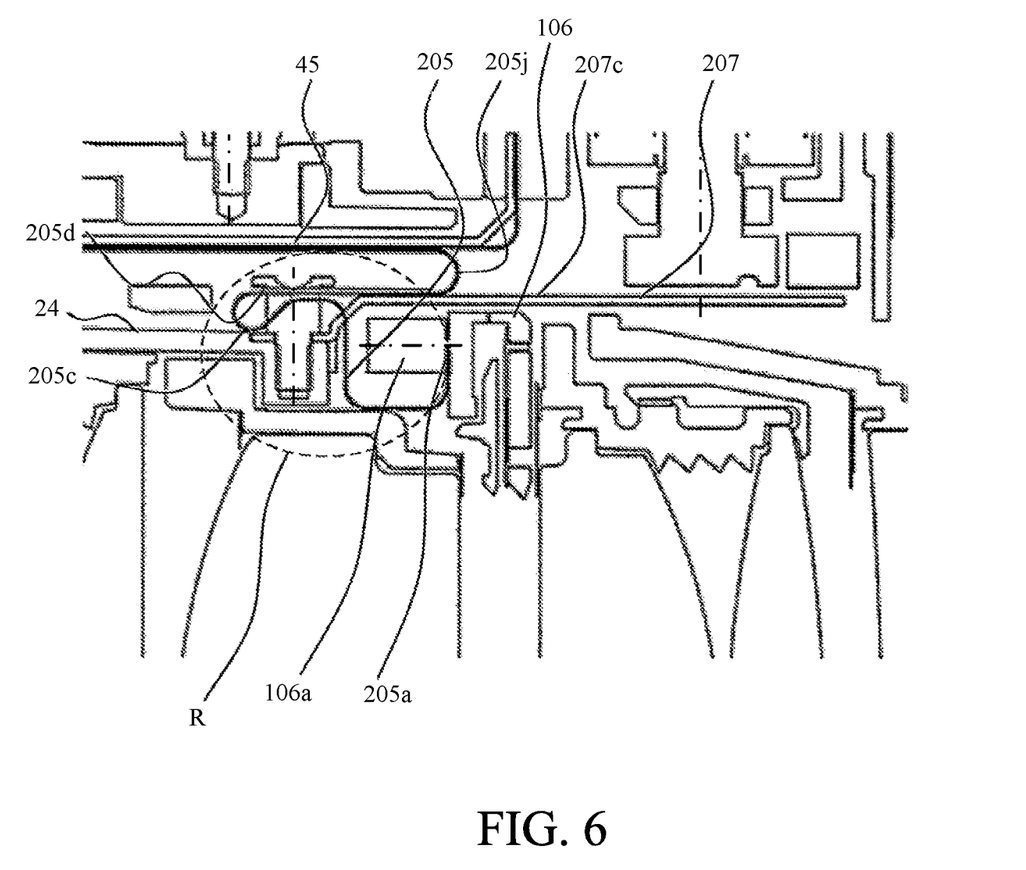
FIG. 6 is an enlarged view of principal part in a lens barrel according to the second embodiment.
Figure 7:
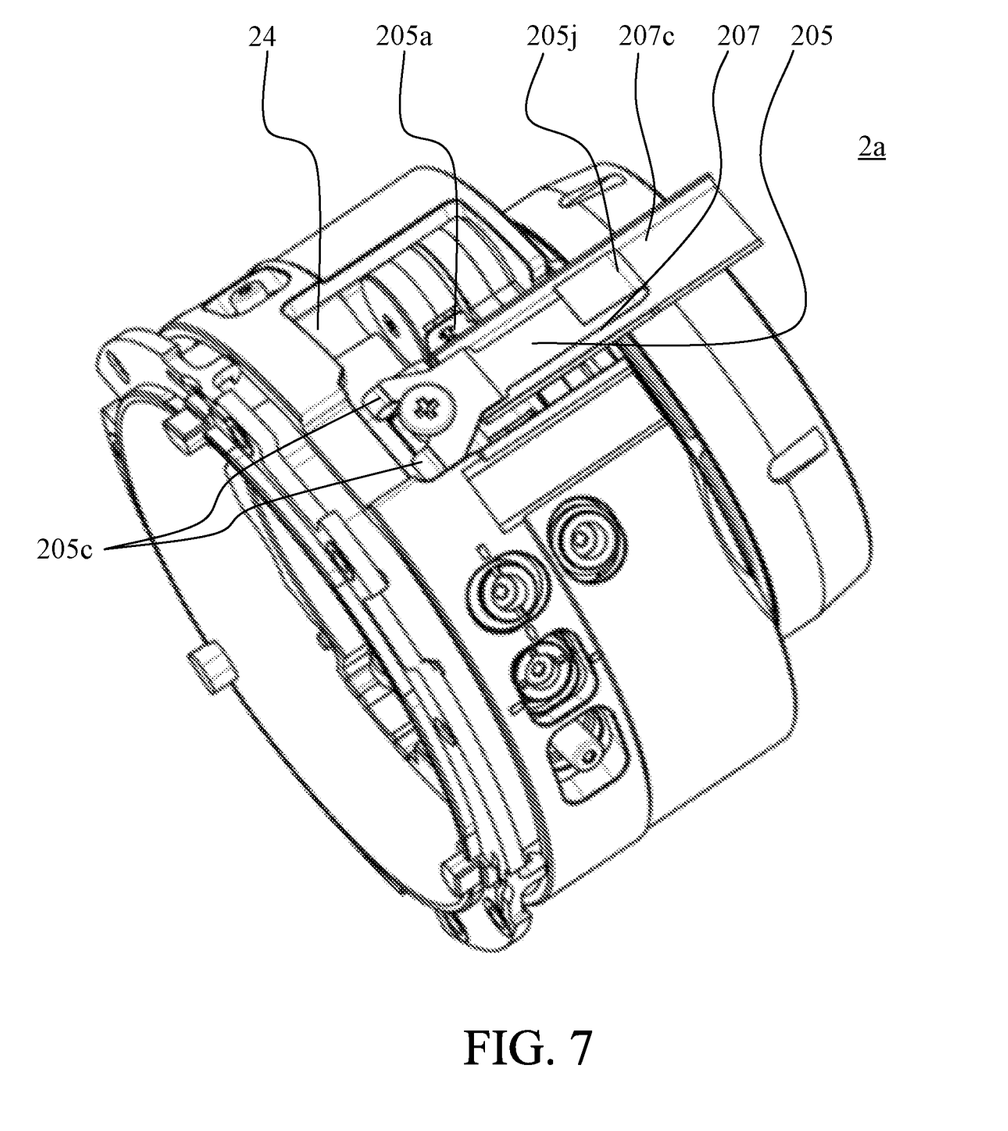
FIG. 7 is a partially perspective view of the lens barrel according to the second embodiment.

Referring now to FIGS. 5 to 7, a description will be given of a second embodiment of the present invention. FIG. 5 is a sectional view of an imaging apparatus 100a according to this embodiment. FIG. 6 is an enlarged view of a dotted, rectangular region R2 of a lens barrel 2a illustrated in FIG. 5. FIG. 7 is a partially perspective view of the lens barrel 2a.

The imaging apparatus 100a according to this embodiment is different from the imaging apparatus 100 according to the first embodiment in that an FPC board 205 includes a second bent part 205j that changes its position in focusing as the holding barrel 24 and the control board 109 move relative to each other. The second bent part 205j changes its position in the optical axis direction in focusing, and the position is guided by a guide surface 207c on a guide member 207. In this embodiment, the holding plate 45 fixes the control board 109 side a range outside the moving range of the second bent part 205j, and the diaphragm unit 106 side is positioned by the fixing component 108 and the guide member 207. Other structures in this embodiment are the same as those of the first embodiment, and a description thereof will be omitted.

The routing of the FPC board 205 from the connector 205a with the driver 106a in the diaphragm unit 106 to the bent part (first bent part) 205c and the contact part 205d that contacts the fixing member 108 due to the reaction force is similar in this embodiment. On the other hand, since the FPC board 205 according to this embodiment has the second bent part 205j that changes its position in focusing after routed by the guide member 207, it is necessary to route the FPC board 205 more stably than the structure in the first embodiment. This is because unstable positioning caused by the reaction force of the FPC board 205 in the routing causes the routing to be inaccurate and the second bent part 205j may interfere with the surrounding components. In addition, when the fixing spot of the FPC board 205 is peeled off due to the reaction force, the second bent part 205j may unintentionally move in focusing and lower the durability.

This embodiment receives the reaction force of the FPC board 205 through the fixing member 108a, and thus suppresses the lift. In addition, the fixing member 108 that fixes the guide member 207 has a lift preventive function, and thus the FPC board can be stably routed in a space-saving manner. The second bent part 205j relatively move in focusing in this embodiment, but the present invention is not limited to this embodiment and the second bent part 205j may move in zooming etc.

When the position of the second bent part 205j moves in focusing or zooming, a guide surface 207c may be provided in a moving range of the second bent part 205j and a range outside the bending range may be fixed onto the guide surface 207c so as to stably maintain the second bent part 205j. As the relative moving amount is larger in focusing or zooming, a moving range of the bent part becomes wider and it is necessary to extend the guide surface 207c in the moving direction. Therefore, a narrower range outside the bent range fixed onto the guide surface 207c is advantageous to the miniaturization. The method of this embodiment can fix the FPC board outside the guide surface and thus is suitable for the miniaturization.

The present invention provides a lens apparatus and an imaging apparatus that can stably routing the FPC board in a space-saving manner.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2017-136698, filed on Jul. 13, 2017, which is hereby incorporated by reference herein in its entirety.

What is claimed is:

1. A lens apparatus comprising:
an optical system;
a holding barrel configured to hold at least part of the optical system;
an electric unit attached to the holding barrel;
a control board configured to control the electric unit;
a flexible printed circuit board configured to connect the electric unit and the control board to each other;
a holding member attached to the holding barrel and configured to hold the flexible printed circuit board; and
a fixing member configured to attach the holding member to the holding barrel,
wherein the flexible printed circuit board includes a first bent part, and the fixing member has a receiving surface configured to receive a reaction force from the first bent part, and wherein the flexible printed circuit board contacts the receiving surface of the fixing member and thereby the flexible printed circuit board sandwiched between the receiving surface and the holding member is positioned.

2. The lens apparatus according to claim 1, wherein the first bent part of the flexible printed circuit board is provided in a routing range between a connector of the flexible printed circuit board with the electric unit and the holding member.

3. The lens apparatus according to claim 2, wherein the flexible printed circuit board has a branched part in the routing range, the first bent part includes at least part of the branched part, and the receiving surface of the fixing member receives the reaction force from the branched part.

4. The lens apparatus according to claim 3, wherein the branched part is of a line symmetry with respect to a line that is parallel to the optical axis and passes a center of the fixing member.

5. The lens apparatus according to claim 3, wherein the fixing member has a shaft part, and the branched part has an opening larger than a projected shape of the fixing member in a radial direction orthogonal to the optical axis.

6. The lens apparatus according to claim 5, wherein the opening is larger than a projected shape of the receiving surface of the fixing member.

7. The lens apparatus according to claim 6, wherein the branched part has an end that is smaller than the projected shape of the receiving surface of the fixing member and larger than the shaft part, and
wherein the flexible printed circuit board is positioned when the shaft part contacts the end.

8. The lens apparatus according to claim 5, further comprising a reinforcing member that contacts the shaft part of the fixing member.

9. The lens apparatus according to claim 1, wherein the holding member holds the flexible printed circuit board along an optical axis direction.

10. The lens apparatus according to claim 1, wherein the flexible printed circuit board contacts the receiving surface of the fixing member and thereby is positioned in a radial direction orthogonal to an optical axis direction.

11. The lens apparatus according to claim 1, wherein the fixing member attaches the holding member to the holding barrel in a radial direction orthogonal to an optical axis direction.

12. The lens apparatus according to claim 1, wherein the holding barrel is movable along an optical axis direction.

13. The lens apparatus according to claim 1, further comprising a reinforcing member that contacts the receiving surface of the fixing member.

14. The lens apparatus according to claim 13, wherein the reinforcing member further contacts the holding member.

15. The lens apparatus according to claim 1, wherein the receiving surface of the fixing member and a guide surface are parallel to each other and do not overlap each other, and
wherein a distance between the receiving surface and the guide surface is equal to or smaller than a thickness of the flexible printed circuit board in a direction perpendicular to the guide surface.

16. The lens apparatus according to claim 1, wherein the flexible printed circuit board has a second bent part that changes a position as the holding barrel and the control board move relative to each other, and
wherein the holding member has a guide surface configured to guide a relative movement of the second bent part.

17. An imaging apparatus comprising:
a lens apparatus; and
an image sensor configured to photoelectrically convert an optical image formed by the lens apparatus,
wherein the lens apparatus includes:
an optical system;
a holding barrel configured to hold at least part of the optical system;
an electric unit attached to the holding barrel;
a control board configured to control the electric unit;
a flexible printed circuit board configured to connect the electric unit and the control board to each other;
a holding member attached to the holding barrel and configured to hold the flexible printed circuit board; and a fixing member configured to attach the holding member to the holding barrel, wherein the flexible printed circuit board includes a first bent part, and the fixing member has a receiving surface configured to receive a reaction force from the first bent part, and wherein the flexible printed circuit board contacts the receiving surface of the fixing member and thereby the flexible printed circuit board sandwiched between the receiving surface and the holding member is positioned.

* * * * *